United States Patent [19]

Wu et al.

[11] Patent Number: 5,605,477
[45] Date of Patent: Feb. 25, 1997

[54] FLEXIBLE ETCHED CIRCUIT ASSEMBLY

[75] Inventors: Jeff C. Wu, Clemmons; Bobby G. Ward, King, both of N.C.

[73] Assignee: The Whitaker Corporation, Wilmington, Del.

[21] Appl. No.: 372,269

[22] Filed: Jan. 13, 1995

[51] Int. Cl.$^6$ .............................. H01R 9/09; H01R 13/66
[52] U.S. Cl. .............................. 439/620; 439/79
[58] Field of Search .............................. 439/79, 67, 620, 439/493, 497

[56]  References Cited

U.S. PATENT DOCUMENTS

| | | | |
|---|---|---|---|
| 4,473,755 | 9/1984 | Imai et al. | 439/620 |
| 4,600,256 | 7/1986 | Anttila | 439/620 |
| 4,784,618 | 11/1988 | Sakamoto et al. | 439/620 |
| 4,894,015 | 1/1990 | Stockero et al. | 439/67 |
| 4,970,624 | 11/1990 | Arneson et al. | 361/398 |
| 4,995,834 | 2/1991 | Hasegawa | 439/620 |
| 5,059,756 | 10/1991 | Henschenp et al. | 219/85.22 |
| 5,150,086 | 9/1992 | Ito | 333/182 |
| 5,151,054 | 9/1992 | Briones et al. | 439/620 |
| 5,194,010 | 3/1993 | Dambach et al. | 439/67 |
| 5,435,732 | 7/1995 | Angulas et al. | 439/67 |

OTHER PUBLICATIONS

Parlex Corporation, Methuen Division, Catalog MD-691, "Advanced Manufacturiing Technology," pp. 5-6.
AMP Incorporated, Catalog 82618, "Action Pin Press-Fit Contacts" Revised Aug. 1993, p. 6.

*Primary Examiner*—Paul T. Sewell
*Assistant Examiner*—Luan K. Bui

[57]  ABSTRACT

An electrical connector assembly (10) is mounted on a printed circuit board (18) and includes a flexible etched circuit (FEC) (15) with electrical traces thereon. The FEC (15) is part of an electrical circuit which includes electrical components (22,24), electrical contacts (23), a ground path (12, 12a), and an electrical connection (90). The FEC can include various electrical components (22,24), for example, in order to filter the electrical circuit.

28 Claims, 6 Drawing Sheets

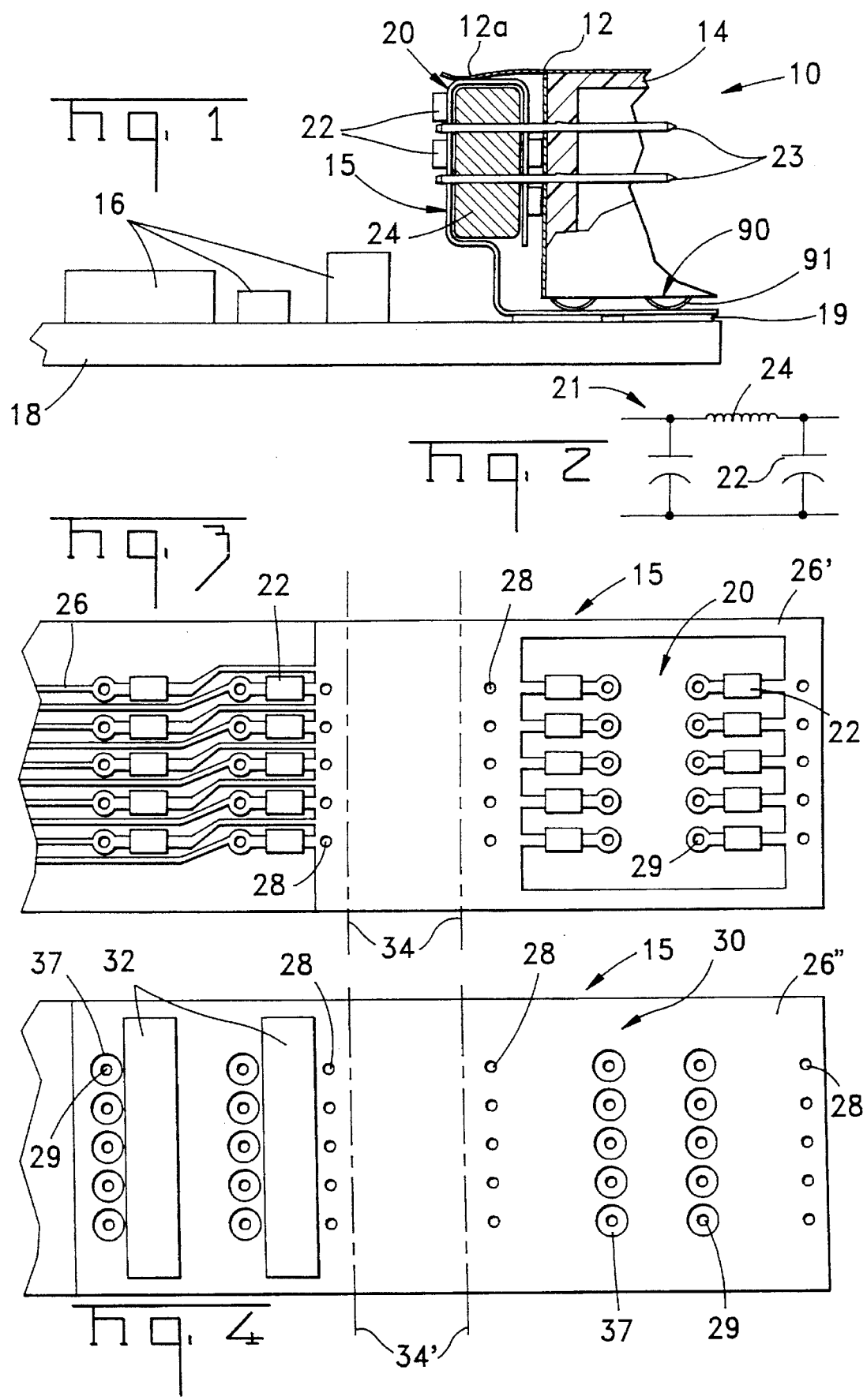

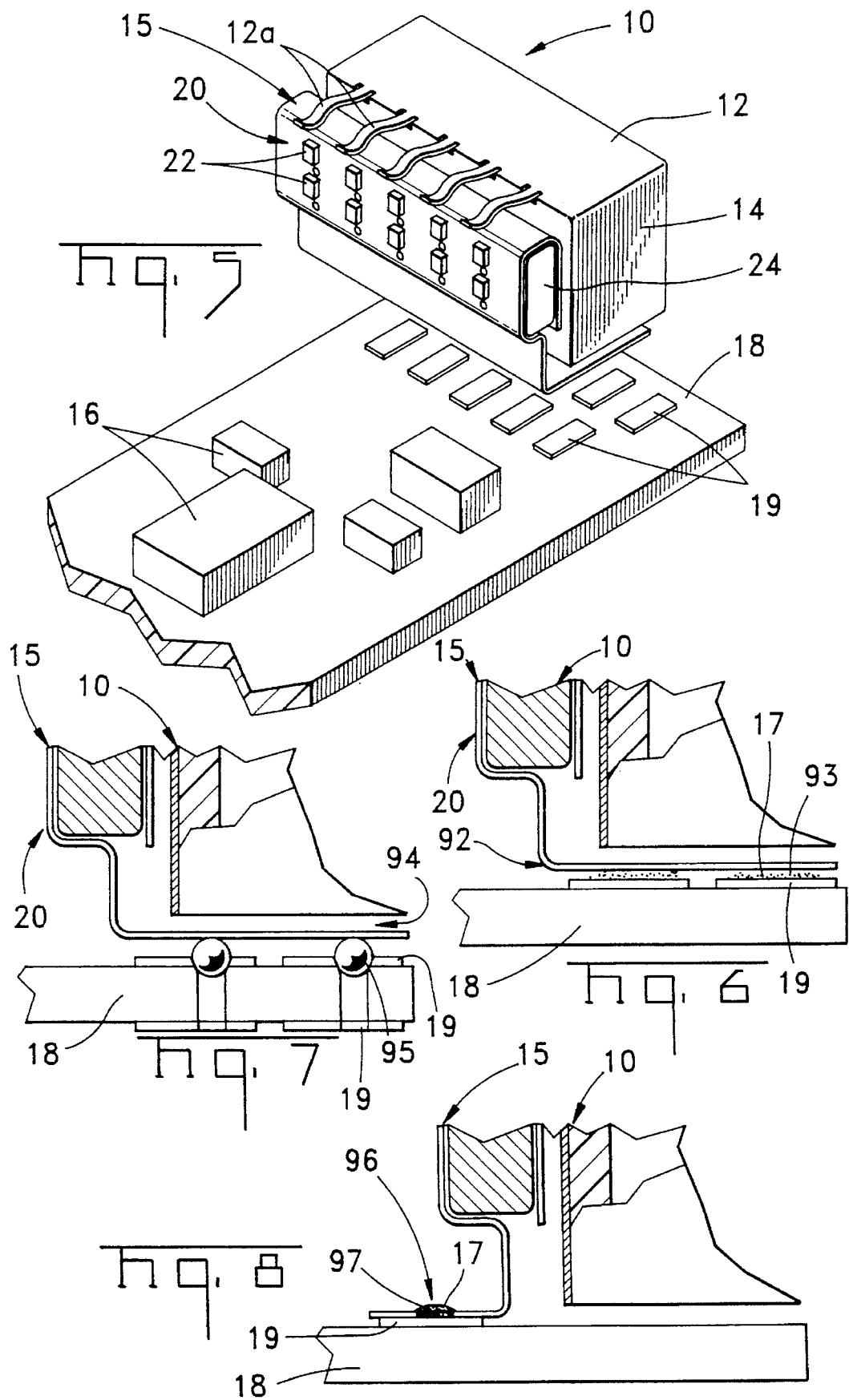

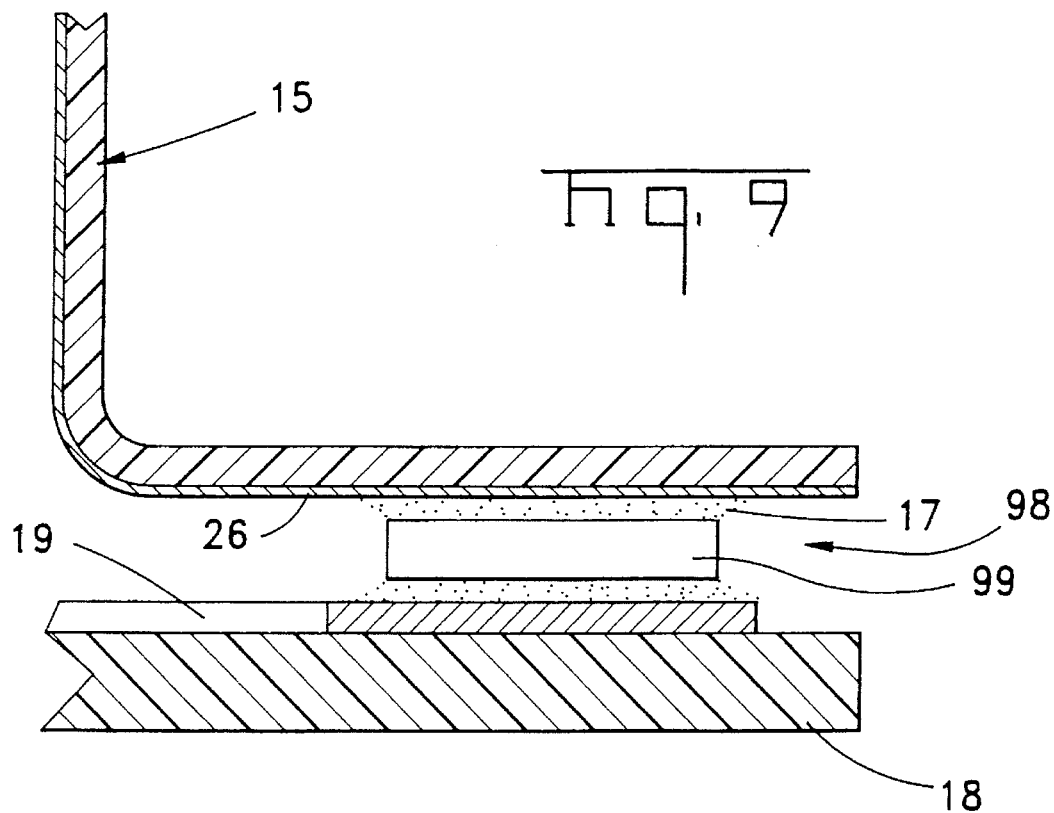
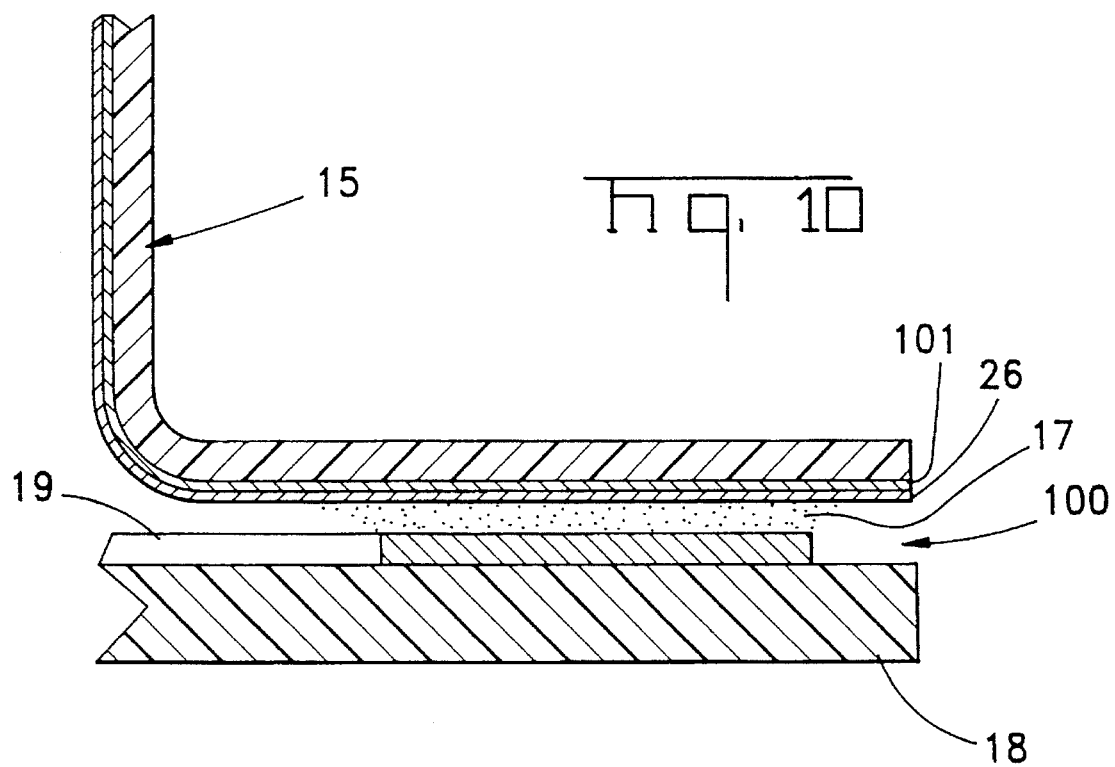

5,605,477

FLEXIBLE ETCHED CIRCUIT ASSEMBLY

FIELD OF THE INVENTION

This invention relates to an electrical connector assembly employing flexible etched circuit (FEC) technology. More particularly, the present invention provides for the use of an FEC in combination with resistors, diodes, capacitors, inductors and other electrical or electronic components.

BACKGROUND OF THE INVENTION

The operation of computers and other electronic equipment is usually accompanied by high frequency noise, otherwise known as Electromagnetic Interference (EMI). The use of filter circuits with electrical connectors is known to reduce the deleterious effects of such high frequency noise. An example of such a circuit is described in U.S. Pat. No. 5,150,086 in which an electrical filter connector comprises a metallic shell having a dielectric housing wherein the housing includes a ferrite plate and capacitors disposed adjacent to through holes in the ferrite plate. This known device provides filtering through capacitive-inductive (LC) and capacitive-inductive-capacitive (CLC) circuits. However, the known device includes electrical contacts which require a series of staggered, bent sections and straight sections which pass through the LC or CLC components. This arrangement requires specialized manufacturing and assembly techniques. As increasing amount of electrical components are incorporated on PCBs, this arrangement utilizes a considerable amount of precious space when it is mounted on a printed circuit board (PCB). Moreover, the known device lacks a broad selection of electrical connection means, components, and PCB locations for the electrical components. Additionally, the known device does not provide intrinsic interconnection between multi-circuit traces on a film or PCB.

In light of the forgoing, the purpose of the present invention is to provide a low-cost, easily assembled and installed FEC device, which is compact, capable of being used in conjunction with a broad range of electrical connection means and components, and yet can provide an adaptable arrangement for the interconnection of multi-circuit systems.

SUMMARY OF THE INVENTION

The present invention provides an electrical connector assembly for use with a printed circuit board (PCB) having electrical traces thereon, and comprises a connector housing with electrical contacts therein, a flexible etched circuit (FEC) member including electrical traces and at least one electrical component disposed on a side of the FEC member in electrical connection with at least one of the FEC traces and at least one of the electrical contacts, a ground plane on a second side of the FEC member, the FEC member further includes an electrically conductive hole therethrough for electrical connection between the electrical component and the ground plane, thereby forming an electrical circuit between the electrical component, the ground plane, and the electrical contact.

BRIEF DESCRIPTION OF THE DRAWINGS

Embodiments of the invention will now be described by way of example with reference to the accompanying drawings in which:

FIG. 1 shows a cross-sectional view of an FEC in the form of, for example, a CLC filtered circuit according to the present invention.

FIG. 2 shows a schematic drawing of the CLC circuit of Fig.1.

FIG. 3 shows the component side of the FEC of the present invention in a planar disposition.

FIG. 4 shows the reverse side of the FEC of FIG. 3.

FIG. 5 shows an isometric drawing of the connector of FIG. 1.

FIG. 6 shows the FEC of FIG. 1 electrically connected to circuit traces on a PCB with the use of a solder connection.

FIG. 7 shows the FEC of FIG. 1 electrically connected to circuit traces on a PCB using a ball grid array connection.

FIG. 8 shows the FEC of FIG. 1 electrically connected to circuit traces on a PCB using a via or through hole.

FIG. 9 shows a further method of connecting the FEC to a PCB applying self-regulating temperature source (SRTS) technology.

FIG. 10 shows the FEC connected to a PCB applying a further type of SRTS technology.

DETAILED DESCRIPTION OF THE INVENTION

Figure 11:
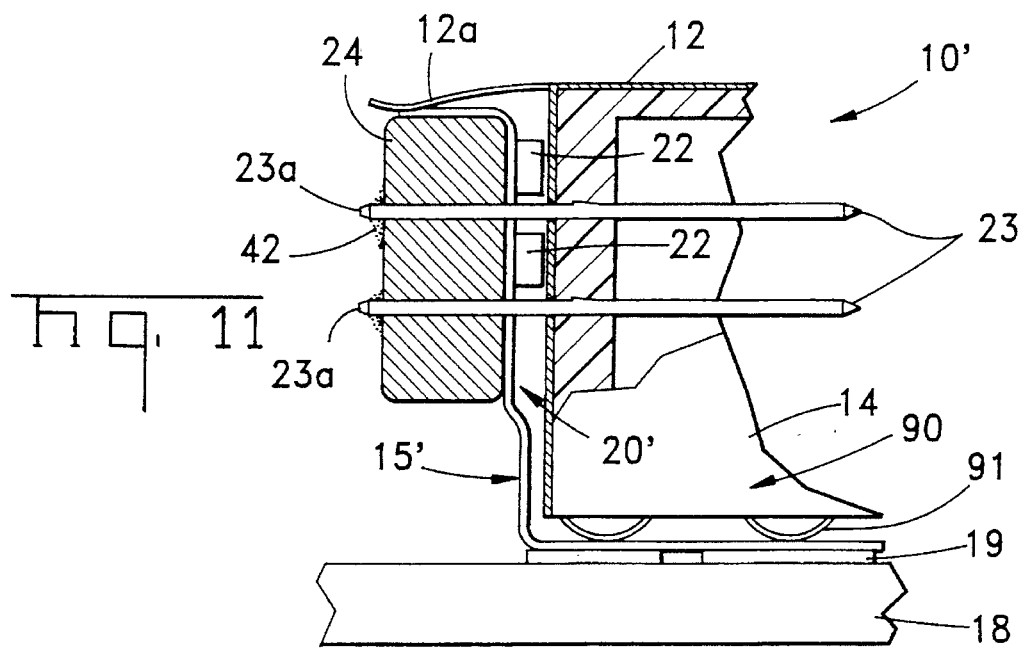
FIG. 11 shows a cross-sectional view of an FEC according to the present invention where the FEC has been adapted to electrically function as an LC circuit.

A preferred embodiment of the present invention will now be described with reference to FIGS. 1–5. FIG. 1 shows a CLC filtered shielded connector 10 having a grounded shield 12, a housing 14, an FEC 15 with circuit traces thereon, and printed circuit board components 16. Filtered connector 10 is mounted on a PCB 18 having staggered electrical traces 19 formed thereon. In the preferred embodiment, filtered connector 10 is located close to an end edge of the PCB 18. FEC 15 is spring biased against circuit traces 19 at spring connection 90 by action of springs 91 for electrical connection therebetween. FIG. 2 represents the overall CLC circuit as a schematic circuit 21 including capacitors 22 connected to each side of inductance 24. As is shown in FIG. 3, FEC 15 has an outer side 20 with chip capacitors 22, circuit traces 26, via (or through) holes 28, and pin holes 29. Pin holes 29 are used to accommodate the passage of contact pins 23 through FEC 15, as is best shown in FIG. 1. Contact pins 23 mechanically join the CLC circuit to the housing 14 (by interference fit in the housing 14), and also serve as electrical conductors as they are electrically connected to the traces on FEC 15 by soldering, press-fitting or other connection methods known to those skilled in the art. FIG. 4 shows a reverse or backside 30 of FEC 15, which side includes stiffeners 32 made of a polyimide material or its equivalent, or a thin layer of copper. Solder resist areas 37 are devoid of conductive material. Additionally, ground plane 26" can serve as part of the shield 12 of housing 14 (not shown in the drawing) if it is formed of a conductive material and is electrically connected to the shield 12 with electrical contacts. Via holes 28 and contact pin holes 29 are shown on the right hand side of FIG. 4, and pin holes 29 are shown on the left hand side of FIG. 4.

Referring to FIG. 3, circuit traces 26 are shown on outer side 20 extending to the right, which traces are joined to form a common, boarder trace 26". Referring again to FIG. 4, backside 30 includes a ground plane or shield 26" covering a portion of FEC 15 which roughly corresponds to the boarder trace 26' of FIG. 3, thereby allowing via holes 28 and solder resist areas 37 to be formed thereat. The area between dotted lines 34 and 34' of FEC 15, as shown in FIGS. 3 and 4, represents the area of FEC 15 which is folded over the top of ferrite plate 24. This fold advantageously describes a compact profile for the filtered connector 10. Although traces 26 are shown between lines 34, a solid copper plate may be placed there instead of distinct traces. As is best shown in FIG. 5, shield fingers 12a extend from the ground shield 12 over to FEC 15, thereby providing a ground path from the FEC to the shield 12.

As described above, FEC 15 is electrically connected to traces 19 of PCB 18 by spring connection 90. The present invention is, however, advantageously adaptable to other methods of electrically connecting FEC 15 to circuit traces 19. For example, such connection methods as are shown in FIGS. 6–10. FIG. 6 shows a standard solder connection 92 having solder 93 between FEC 15 and circuit traces 19. FIG. 7 shows FEC 15 joined to circuit traces 19 with a ball grid array contact assembly 94 having solder balls 95. FIG. 8 shows a via hole assembly 96 having a via hole 97 with solder 17.

Referring now to FIGS. 9 and 10, FEC 15 is connected to circuit traces 19 with the use of SRTS technology as embodied in, for example, US-A-5059756 which is hereby expressly incorporated by reference in its entirety. Power finger 99, as shown in FIG. 9, is located between PCB traces 19 and traces 26 on FEC 15 along with an adequate amount of solder 17. Solder 17 is then re-flowed by conduction of thermal energy from power finger 99, which finger is a bimetallic strip of highly conductive metal (e.g. Copper) cladded with a metal of high magnetic permeability (e.g. iron or nickel alloy) (not shown in the drawing). The bimetallic strip in turn derives its energy through induction from a source of constant amplitude alternating current (AC source) (not shown in the drawing). When the AC source is energized, the bimetallic strip heats up which causes power finger 99 to heat up to a temperature suitable to reflow solder 17. FIG. 10 likewise shows an SRTS solder joint 100, whereby an SRTS strip 101 comprises a cladding on trace 26, and which trace is formed of a material having a high conductivity (e.g. Copper). Strip 101 is a material having a high magnetic permeability (e.g. iron or nickel alloy). Electromagnetic energy emanating from an induction coil (not shown in the drawing) will be transformed into thermal energy by SRTS joint 100 to thereby reflow solder 17 and thus make the electrical connection.

Figure 12:
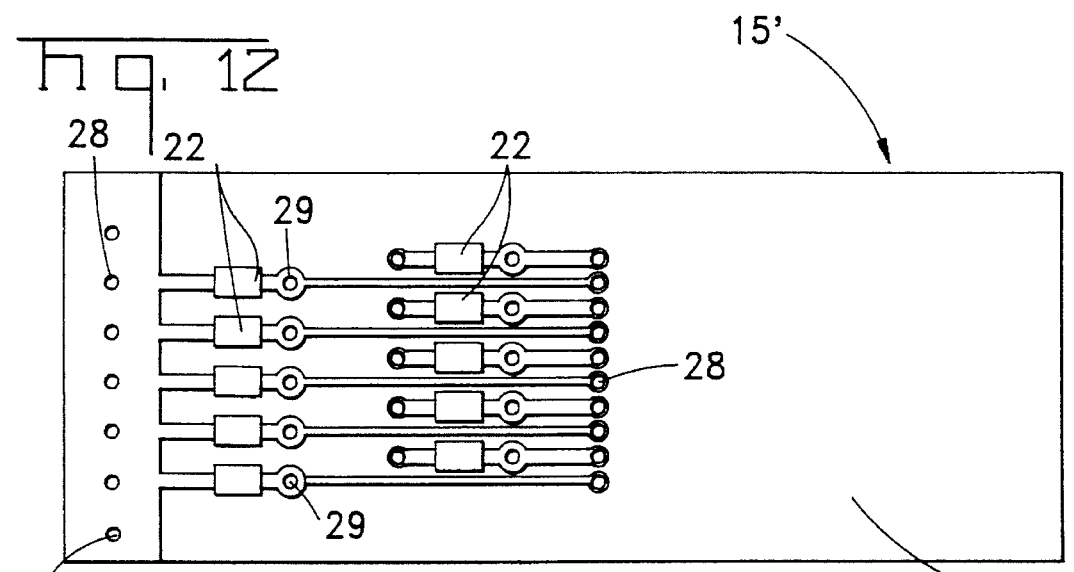
FIG. 12 shows the outer side of the FEC of FIG. 11 in a planar disposition.
Figure 13:
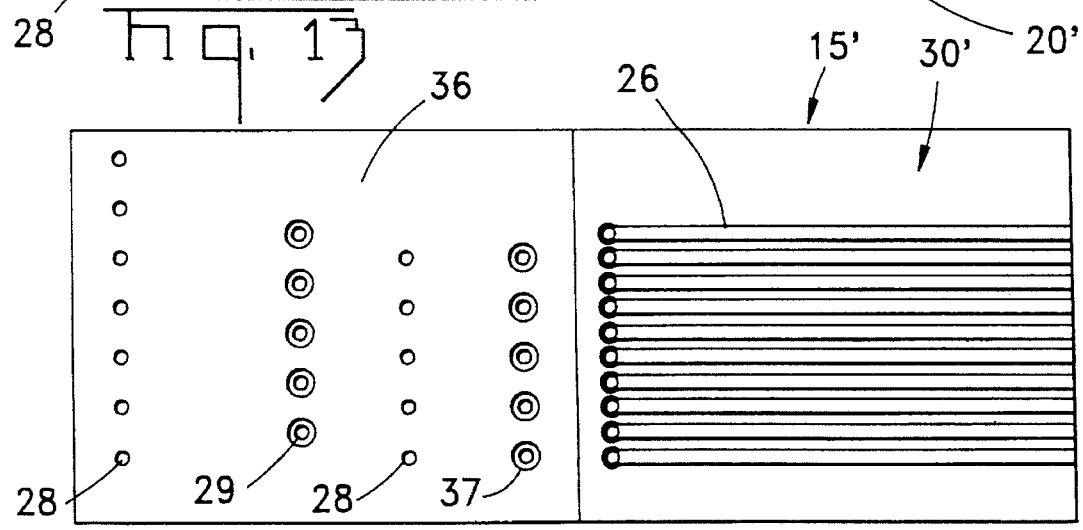
FIG. 13 shows the reverse side of the FEC of FIG. 12.

FIGS. 11–13, which show a second embodiment of the invention, will now be described. FIG. 11 shows FEC 15' connected to shield 12 of filtered connector 10' by fingers 12a. FEC 15' includes chip capacitors 22 between the ferrite plate 24 and housing 14, is connected to end sections 23a of pins 23 by, for example, conductive adhesive 42, and is connected to board traces 19 at spring connection 90; FEC 15' is thereby adapted to function as a CL filter. FIG. 12 shows an outside, or capacitor mounting portion 20' of FEC 15', and FIG. 13 shows the reverse side of FEC 15'. As in the CLC embodiment of FIGS. 1–4, contact pins 23 mechanically join FEC 15' to housing 14 and serve as electrical conductors. Referring again to FIG. 13, back side 30' of FEC 15' is shown with a ground plane 36, via holes 28, pin holes 29, and solder resist areas 37 which are devoid of conductive material.

Figure 14:
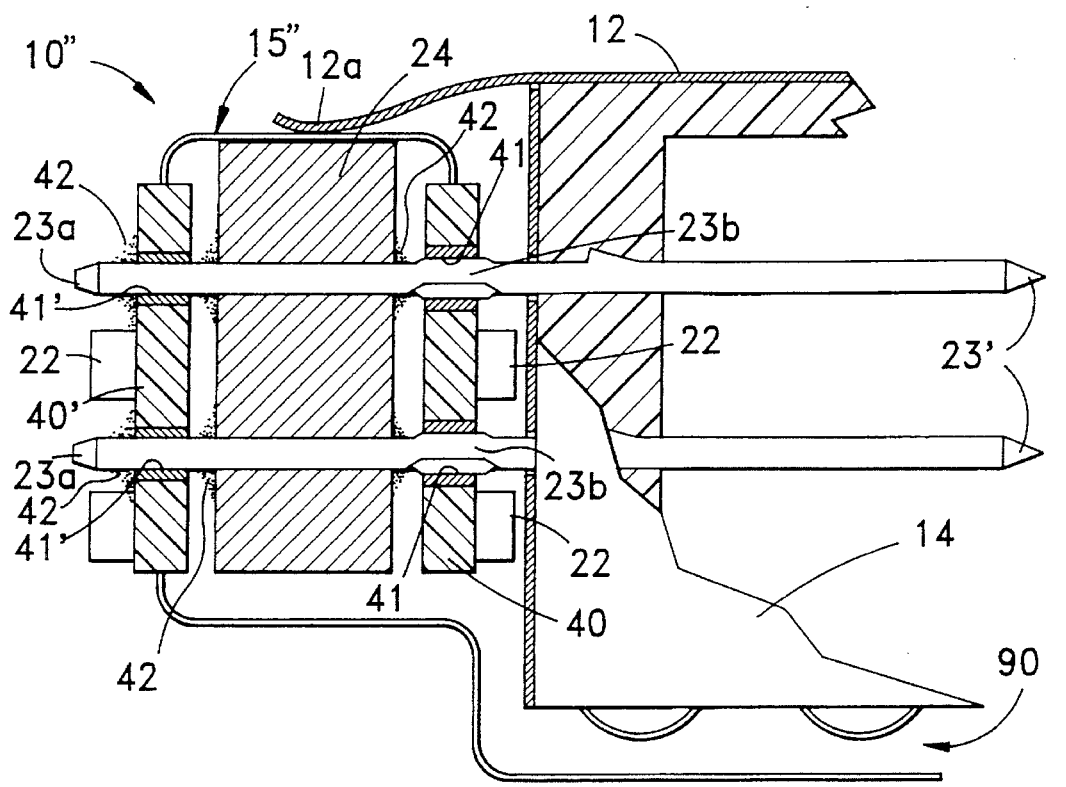
FIG. 14 shows a cross-sectional view of a further adaptation of the FEC of the present invention applying rigid-flex circuit technology.
Figure 15:
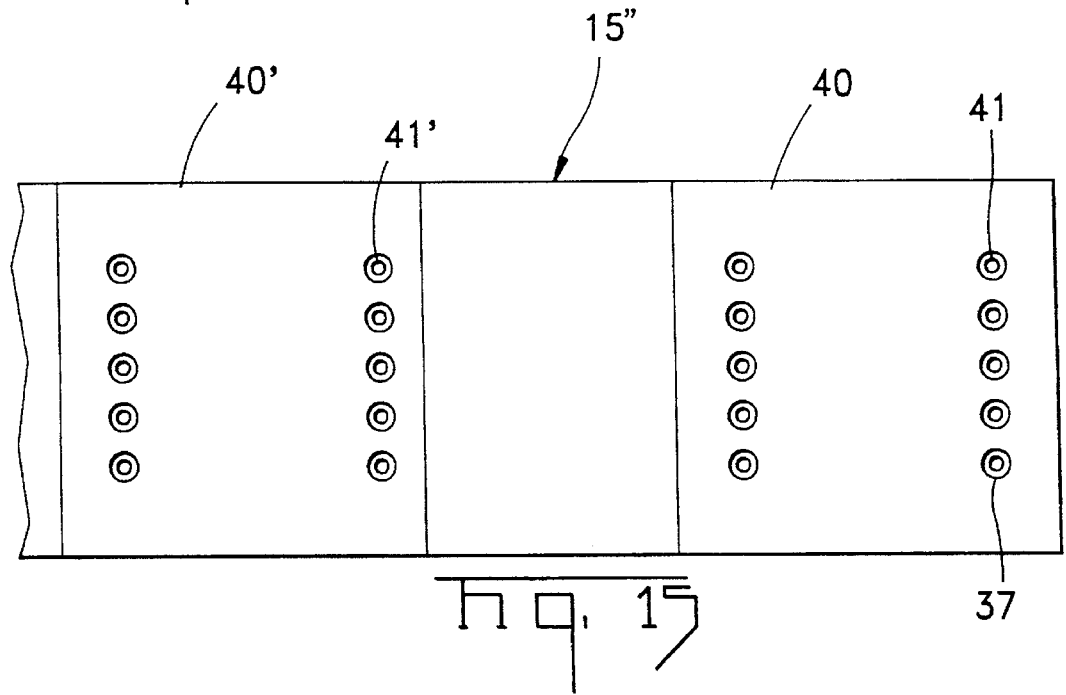
FIG. 15 shows the outer side of the FEC of FIG. 14 in a planar disposition.

In a further embodiment of the present invention, an interconnection arrangement 10" is shown in FIGS. 14–15, which arrangement comprises a rigid-flex circuit system 15". As shown in FIG. 14 rigid-flex circuit system 15" comprises rigid portions 40 with plated holes 41 electrically connected to compliant sections 23b of pins 23', and plated holes 41' connected to end sections 23a of pins 23' by conductive adhesive 42. Conductive adhesive 42 is also used to connect ferrite plate 24 to pins 23'. The compliant pins are preferably of the AMP ACTION PIN press-fit type, for example, which are commercially available from AMP Incorporated. The rigid-flex system is, for example, of a multi-circuit design and is commercially available such as through the FLEXILAYER product line of Parlex Corporation. Although a spring connection 90 is shown, it is contemplated that an electrical connection comprising solder 92, a ball grid array 94, via (or through) holes 96, or an SRTS 98 or 100 could be used to make the termination. FIG. 15 shows the ferrite plate 24 side of FEC 15" with a flexible portion of the FEC disposed between rigid portions 40.

Figure 16:
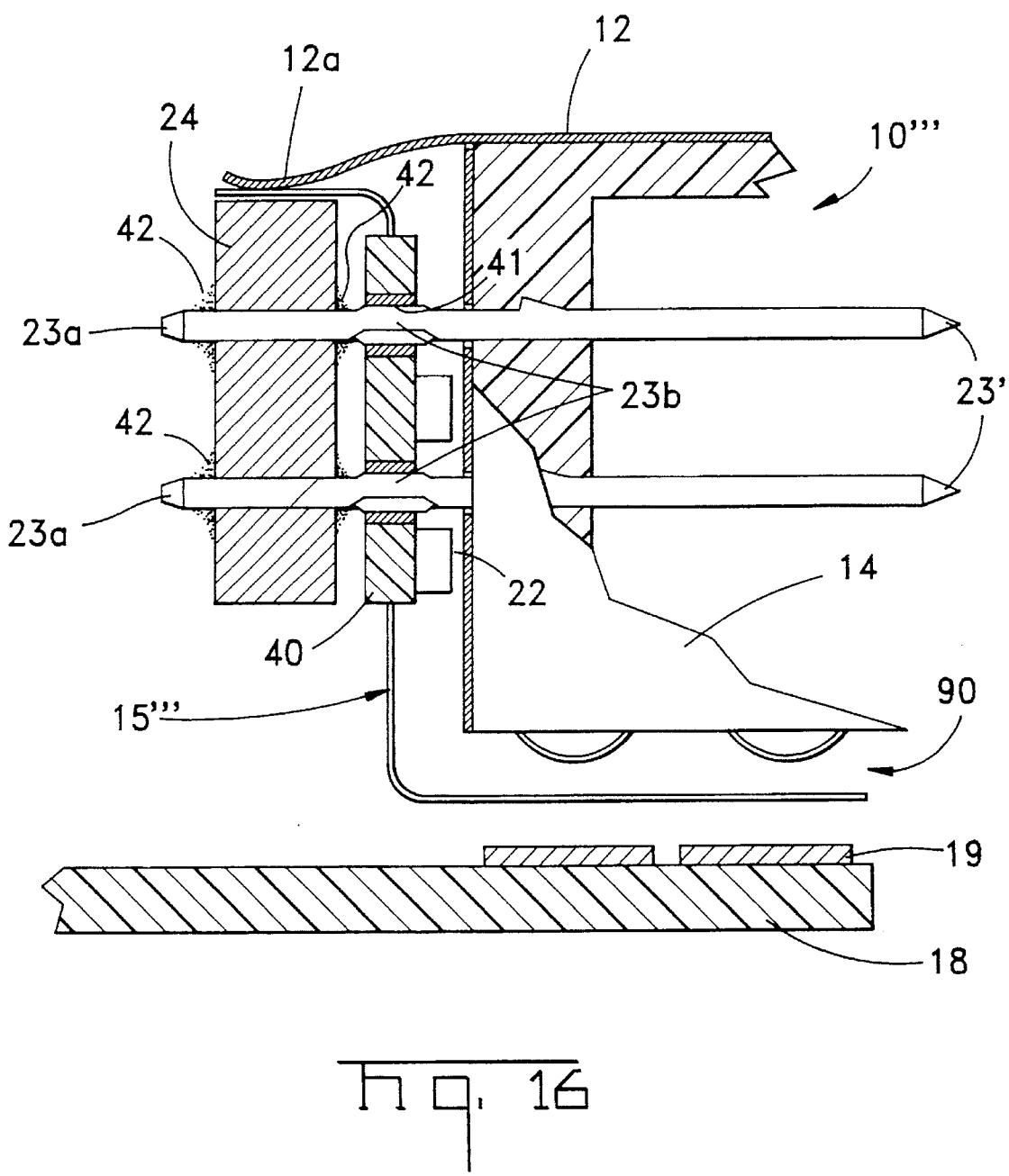
FIG. 16 is a cross-sectional view of another embodiment of the present invention employing a rigid-flex circuit in combination with electrical components.

Another embodiment of the present invention is shown in FIG. 16 and comprises a CL circuit 10''', wherein FEC 15''' is mounted to housing 14 by pins 23'. Pins 23', as was described in the preceding embodiment of FIG. 14, include compliant sections 23b connected to plated holes 41 of rigid portion 40, and end sections 23a connected to ferrite plate 24 by conductive adhesive 42. Conductive adhesive 42 is also used to connect ferrite plate 24 to pins 23'. FEC 15''' is connected to circuit traces 19 at, for example, spring connection 90. The top side of FEC 15'''is connected to shield 12 by fingers 12a. However, capacitors 22 are connected to FEC 15''' for making a CL circuit in combination with a rigid-flex circuit.

The above-described embodiments of the present invention show and teach advantages which will be evident including low cost, and ease of manufacture and assembly. Moreover, because an FEC is used, a compact design can be achieved while maintaining a highly reliable filtered circuit. Additionally, the present invention is advantageously adaptable to a plurality of electrical connection methods, thereby facilitating assembly thereof to a PCB given many circuit design requirements. For example, the FEC circuit can be disposed in a shape which closely conforms to any side of an electrical connector, thereby saving space on the PCB.

Several embodiments of a filtered connector applying FEC technology have thus been disclosed; however, modification of the invention can be made without departing from the spirit of the invention or the scope of the appended claims. For example, FECs 15, 15', and 15" can be formed in a shape other than a rectangular shape, and the circuit traces thereon can be of various dimensions and configurations, including multi-circuit configurations. Additionally, although a CLC circuit is shown on FEC 15, it is contemplated that electrical components other than capacitors and inductors could be used on FEC 15, 15', 15" in meeting the needs of a given electrical circuit design application: for example, resistors, LEDs, and etc. can be placed on the FEC. Furthermore, although FEC 15" is shown without electrical components mounted thereon, it is anticipated that such components could be placed on or adjacent to, for example, rigid portions 40. Moreover, although a single circuit FEC has been shown using via holes to effectuate electrical connections, it is contemplated that through holes, and/or the use of such conductive adhesives as are taught in U.S. Pat. No. 4,970,624 (which is hereby incorporated by reference in its entirety), can be used efficaciously in the making of electrical connections between multi-FEC circuits. Further, the traces 19 on the PCB can be placed in a straight, rather than staggered, pattern. In addition, although FECs 15, 15', and 15'' are shown as mechanically joined to the housing 14 by an interference fit of pins 23,23', it is contemplated that the FECs can be adhesively bonded, soldered, clamped, mechanically attached, or otherwise fastened to the housing 14. Additionally, although the plastic housing 14 is shown as having a metal shield 12, it is contemplated that it could be of a die cast or plated housing type, conductive coating painted or sputtered metal housings.

Thus, while several embodiments of the present invention have been described with reference to the drawing Figures, it is to be understood by persons of ordinary skill in the art that the invention is not to be strictly limited to such embodiments but, rather, may be otherwise variously embodied and practiced within the scope of the following claims.

Accordingly, what is claimed is:

1. An electrical connector assembly for use with a printed circuit board (PCB) having electrical traces thereon, including a connector housing with electrical contacts therein, said electrical connector assembly comprising:

a flexible etched circuit. (FEC) member having electrical traces and at least one electrical component disposed on a first side thereof in electrical connection with at least one of said FEC traces and at least one of said electrical contacts, a ground circuit on a second side of said FEC member, said FEC member further includes at least one electrically conductive hole therethrough for electrical connection between said electrical component and said ground circuit, thereby forming an electrical circuit between said electrical component, said ground plane, and said at least one electrical contact; and plane, and said at least one electrical contact; and wherein said FEC member is at least partially wrapped around a ferrite plate.

2. The connector assembly of claim 1, wherein the FEC member is mounted to said connector housing.

3. The connector assembly of claim 1, wherein said at least one electrical contact comprises a pin member.

4. The connector assembly of claim 3, wherein said pin passes through said FEC member for electrical contact therewith.

5. The connector assembly of claim 3, wherein said pin passes through a plate which supports said FEC member.

6. The connector assembly of claim 1, wherein at least one said electrical component is disposed between said housing and said FEC member for electrical connection with said at least one electrical contact.

7. The connector assembly of claim 6, wherein said FEC member is at least partially wrapped around a plate.

8. The connector assembly of claim 7, wherein said plate is a ferrite plate.

9. The connector assembly of claim 6, wherein said at least one electrical contact comprises a pin member.

10. The connector assembly of claim 9, wherein said pin passes through said FEC member for electrical contact therewith.

11. The connector assembly of claim 9, wherein said pin passes through a plate which supports said FEC member.

12. The connector assembly of claim 1, wherein said FEC member comprises a rigid-flex circuit having at least one circuit trace thereon in electrical connection with said at least one electrical contact.

13. The connector assembly of claim 12, wherein said at least one electrical contact comprises a compliant pin section for engagement with said rigid-flex circuit.

14. The connector assembly of claim 12, wherein a rigid portion of said rigid-flex circuit is disposed against a portion of said housing.

15. The connector assembly of claim 12, wherein said rigid-flex circuit comprises a pair of rigid portions or one rigid portion.

16. The connector assembly of claim 15, wherein a plate member is disposed between said rigid portions.

17. The connector assembly of claim 16, wherein said plate member is a ferrite plate.

18. The connector assembly of claim 1, wherein at least one conductive finger is formed on said housing for providing a ground path from said FEC member.

19. The connector assembly of claim 1, wherein said FEC member includes at least one stiffener for mounting electrical components adjacent thereto.

20. The connector assembly of claim 19, wherein said stiffener is mounted on a side opposite to said at least one electrical component, relative to said FEC member.

21. The connector assembly of claim 1, wherein said FEC member is connected to said PCB traces by solder.

22. The connector assembly of claim 1, wherein said FEC member connected to said PCB traces by spring means.

23. The connector assembly of claim 1, wherein said FEC member connected to said PCB traces by a ball-shaped contact.

24. The connector assembly of claim 1, wherein said FEC member is connected to said PCB electrical traces by solder with a via hole.

25. The connector assembly of claim 1, wherein said FEC member a multi-circuit FEC member having multiple FEC member layers.

26. The connector assembly of claim 1, wherein said FEC member connected to said PCB traces with a self-regulating temperature source power finger.

27. The connector assembly of claim 1, wherein said FEC member includes at least one trace having a cladding of high magnetic permeability for electrically connecting said FEC member to said PCB traces as a self-regulating temperature source.

28. The connector assembly of claim 12, wherein said rigid-flex member comprises a second electrical component connected to said trace.

\* \* \* \* \*